US012695373B2

(12) United States Patent (10) Patent No.: US 12,695,373 B2

D'Angelo et al. (45) Date of Patent: Jul. 28, 2026

---

(54) DRIVER CIRCUIT WITH DISCHARGE CONTROL, CORRESPONDING ELECTRONIC SYSTEM AND VEHICLE

(71) Applicant: STMicroelectronics International N.V., Geneva (CH)

(72) Inventors: Vittorio D'Angelo, Nocera Superiore (IT); Salvatore Cannavacciuolo, Villaricca (IT)

(73) Assignee: STMicroelectronics International N.V., Geneva (CH)

( * ) Notice: Subject to any disclaimer, the term of this patent is extended or adjusted under 35 U.S.C. 154(b) by 381 days.

(21) Appl. No.: 18/441,537

(22) Filed: Feb. 14, 2024

(65) Prior Publication Data

US 2024/0305185 A1 Sep. 12, 2024

(30) Foreign Application Priority Data

Mar. 9, 2023 (IT) ........................ 102023000004365

(51) Int. Cl.
   H02P 6/12 (2006.01)
   B60R 16/03 (2006.01)
   (Continued)

(52) U.S. Cl.
   CPC ............. H02M 1/088 (2013.01); B60R 16/03 (2013.01); H03K 17/6871 (2013.01);
   (Continued)

(58) Field of Classification Search
   CPC .. H02P 8/00; H02P 27/00; H02P 29/02; H02P 29/0241; H02P 5/46;
   (Continued)

---

(56) References Cited

U.S. PATENT DOCUMENTS

| | | |
|---|---|---|
| 11,648,896 B2 | 5/2023 | D'Angelo et al. |
| 2016/0164506 A1 | 6/2016 | Almazon et al. |

(Continued)

FOREIGN PATENT DOCUMENTS

| | | |
|---|---|---|
| CN | 105978309 A | 9/2016 |
| CN | 107852155 A | 3/2018 |

(Continued)

*Primary Examiner* — Kawing Chan

*Assistant Examiner* — Charles S Laughlin

(74) *Attorney, Agent, or Firm* — Slater Matsil, LLP

(57) ABSTRACT

A driver circuit includes high- and low-side switches coupled to first and second output pins, respectively, that are couplable to a power switch control terminal. High- and low-side drive circuits supplied by programmable and fixed voltages, respectively, drive the high- and low-side switches, respectively. A voltage generator receives a programming signal and produces the programmable voltage. Control circuitry coupled to the high- and low-side drive circuits receives an input command signal indicating initiation of a discharge action, in response to which the control circuitry asserts a drive signal to activate the high-side drive circuit, turning on the high-side switch and clamping the first output pin at the programmable voltage. In response to expiration of a time interval, the control circuitry de-asserts the drive signal to activate the low-side drive circuit, turning on the low-side switch and tying the second output pin to the second supply voltage node.

20 Claims, 3 Drawing Sheets

(51) Int. Cl.
　　*H02M 1/088*　　　(2006.01)
　　*H02P 6/18*　　　　(2016.01)
　　*H03K 17/687*　　 (2006.01)
　　*H02P 27/08*　　　(2006.01)

(52) U.S. Cl.
　　CPC ...... *H02P 27/08* (2013.01); *H03K 2217/0063*
　　　　　　　(2013.01); *H03K 2217/0072* (2013.01)

(58) Field of Classification Search
　　CPC .. H02P 2203/07; H02P 25/034; H02P 29/024;
　　　　　　H02P 29/025; H02P 29/68; H02P 3/08;
　　　　　　H02P 3/12; H02P 3/14; H02P 3/22; H02P
　　　　　　　　　　　　　　5/685; H02P 6/12
　　See application file for complete search history.

(56)　　　　　　　　References Cited

U.S. PATENT DOCUMENTS

| | | |
|---|---|---|
| 2016/0268919 A1 | 9/2016 | Halberstadt |
| 2018/0145503 A1 | 5/2018 | Minagawa |
| 2019/0199200 A1 | 6/2019 | Eberlein et al. |

FOREIGN PATENT DOCUMENTS

| | | |
|---|---|---|
| EP | 3068022 A1 | 9/2016 |
| EP | 3975402 A1 | 3/2022 |
| WO | 2016091593 A1 | 6/2016 |
| WO | 2017186419 A1 | 11/2017 |

DRIVER CIRCUIT WITH DISCHARGE CONTROL, CORRESPONDING ELECTRONIC SYSTEM AND VEHICLE

CROSS-REFERENCE TO RELATED APPLICATIONS

This application claims the priority benefit of Italian Patent Application No. 102023000004365, filed on Mar. 9, 2023, entitled "Driver circuit with discharge control, corresponding electronic system and vehicle," which is hereby incorporated herein by reference to the maximum extent allowable by law.

TECHNICAL FIELD

The description relates to gate driver devices for high-voltage applications. In particular, the description relates to techniques for actively discharging a high-voltage (HV) energized element such as a capacitor, usually referred to as direct-current (DC) link capacitor, briefly DC-Link capacitor.

Such techniques may be applied, for instance, in traction inverters as well as DC/DC, DC/(alternating current (AC) and AC/DC converters for electric vehicles (EVs), hybrid electric vehicles (HEVs) and industrial applications.

More generally, such techniques may be applied to any power conversion system exploiting a high-voltage energized element for filtering or stability purposes, and/or to any type of apparatus where fast de-energization of an energy-storing element for functional and/or safety purposes is a desirable feature.

BACKGROUND

High-voltage systems (e.g., DC/DC converters and traction inverters) may include one or more energy-storing elements such as one or more high-voltage DC-Link capacitors LC, as exemplified in the circuit diagram of FIG. 1. Capacitor LC is arranged between a first (e.g., positive) high-voltage rail HV+ and a second (e.g., negative or ground) high-voltage rail HV− to stabilize the voltage $V_{DC}$ therebetween. Capacitor LC may have a high capacitance value (e.g., 1 mF or more) and may be charged to a high voltage (e.g., 800 V or more). A half-bridge circuit (or a plurality of half-bridge circuits) may be arranged between the high-voltage rails HV+ and HV− to drive a respective load (e.g., a phase of an electric motor) via a pulse-width modulated (PWM) signal generated at the switching node of the half-bridge circuit. For instance, FIG. 1 illustrates a half-bridge circuit including a high-side power switch Q1 arranged between rail HV+ and a switching node LX, and a low-side power switch Q2 arranged between the switching node LX and rail HV−. The power switches Q1 and Q2 may include power transistors such as silicon carbide (SiC) power MOSFETs or Insulated-Gate Bipolar Transistors (IG-BTs). The power switches Q1 and Q2 may be driven by respective control signals produced by an (isolated) gate driver device, not visible in FIG. 1, which provides galvanic isolation between a low-voltage domain (e.g., coupled to a microcontroller) and a high-voltage domain where the power switches Q1 and Q2 are implemented.

In such systems, capacitor LC may be rapidly discharged for safety purposes in various scenarios, including but not limited to shutdown of the motor ignition, loss of (e.g., 12 V) power supply, failure of a controller (e.g., a microcontroller unit, MCU). For instance, discharging the capacitor LC so that voltage $V_{DC}$ falls below 60 V in less than 1 second may be desirable in order to avoid electrical shock hazard for users and/or the generation of unwanted torque at the motor driven by the half-bridge circuit(s).

In various applications, it is desirable to implement the DC-Link active discharge function without using additional discharge circuits, in order to reduce the cost of components. This can be obtained by using the (e.g., three-phase) inverter stage to carry out the discharge function, i.e., by deliberately performing a shoot-through at one or more "legs" of the inverter (e.g., one or more half-bridge circuits Q1, Q2 that drive a phase of the motor). A shoot-through discharge technique as discussed herein can thus be implemented in parallel on the three phases, which may thus co-operate in discharging the DC-Link capacitor during shoot-through. Intentionally performing a shoot-through would normally correspond to a hard system failure, which should be otherwise avoided due to possible fire hazard: in fact, if not properly controlled, the current during shoot-through could easily reach several kA in a few hundred nanoseconds. In this regard, document EP 3975402 A1 discloses a circuit for discharging a DC-Link capacitor by carrying out shoot-through of the inverter phases based on a closed-loop architecture.

In view of the fact that the system supply voltage (e.g., DC-Link voltage $V_{DC}$) may be as high as 800 V and that the electrical components mounted on the system PCB may have very low inductance values (e.g., a total inductance of 20 nH), the slope of the shoot-through current may be as high as 40 A/ns. The known solutions may not be robust enough to withstand such high current values. Additionally, the closed-loop approach of the known solutions introduces a reaction delay that may be incompatible with the target of limiting the current peak below the safe operating area (SOA) of the external driver. Additionally, the known solutions may lack a soft shut-down procedure (e.g., two-level turn-off, soft turn-off, or mixed) and this may lead to dangerous overshoots on the output voltage of the external power driver (e.g., drain-source voltage, collector-emitter voltage), which in turn may result in device breakdown.

Therefore, there is a need in the art to provide improved driver circuits that are more robust with regard to DC-Link active discharge via controlled shoot-through.

SUMMARY

An object of one or more embodiments is to contribute in providing such improved driver circuits.

According to one or more embodiments, such an object can be achieved by a driver circuit having the features set forth in the claims that follow.

One or more embodiments may relate to a corresponding electronic system.

One or more embodiments may relate to a corresponding vehicle.

The claims are an integral part of the technical teaching provided herein in respect of the embodiments.

According to an aspect of the present description, a driver circuit (e.g., an integrated circuit) includes a high-side switch coupled between a first supply voltage node and a first output pin of the driver circuit, and a low-side switch coupled between a second output pin of the driver circuit and a second supply voltage node. The first and second output pins are configured to be coupled to a control terminal of a power switch to provide thereto a control signal (e.g., a discharge signal). For instance, the control signal may be used to cause the power switch to become conductive and so provide an electrical discharge path for discharging an energized element that is electrically coupled (e.g., in parallel) to the power switch. The driver circuit further comprises a high-side drive circuit supplied by a programmable voltage and configured to drive the high-side switch, and a low-side drive circuit supplied by a fixed voltage and configured to drive the low-side switch. A programmable voltage generator circuit is configured to receive a programming signal and produce the programmable voltage as a function thereof. Control circuitry coupled to the high-side and low-side drive circuits is configured to receive an input command signal; in response to assertion of the input command signal (e.g., the input command signal including a rising edge to indicate that a discharge action is initiated), assert a drive signal to activate the high-side drive circuit, whereby the high-side switch is turned on and the voltage at the first output pin is clamped at the programmable voltage minus a threshold voltage of the high-side switch, and whereby the low-side switch is turned off; and, in response to expiration of a time interval after assertion of the internal command signal, de-assert the drive signal to activate the low-side drive circuit, whereby the low-side switch is turned on and the second output pin is tied to the second supply voltage node, and whereby the high-side switch is turned off.

With the operation disclosed above, the control signal for the power switch is produced at the first and second output pins of the driver circuit.

One or more embodiments may thus provide a robust driver circuit that produces a control signal for a power switch, the control signal being usable to activate a controlled shoot-through of the power switch to discharge an energized element electrically coupled (e.g., in parallel) to the power switch.

According to another aspect of the present description, an electronic system (e.g., mounted on a printed circuit board, PCB) includes a first high-voltage rail and a second high-voltage rail, a stabilization capacitor coupled between the first and second high-voltage rails, and a half-bridge circuit coupled between the first and second high-voltage rails. The half-bridge circuit includes a high-side power switch arranged between the first high-voltage rail and a switching node as well as a low-side power switch arranged between the switching node and the second high-voltage rail. The system includes a driver circuit according to one or more embodiments: the first and second output pins of the driver circuit are coupled to a control terminal of a first one of the high-side and low-side power switches to provide thereto the control signal. During a discharge phase of the stabilization capacitor, one of the high-side and low-side power switches is forced to a steady conductive state and the other of the high-side and low-side power switches receives the control signal from the driver circuit to discharge the stabilization capacitor.

According to another aspect of the present description, a vehicle includes an electronic system according to one or more embodiments. The vehicle further includes an electric motor having at least one winding configured to be driven by the half-bridge circuit of the system.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
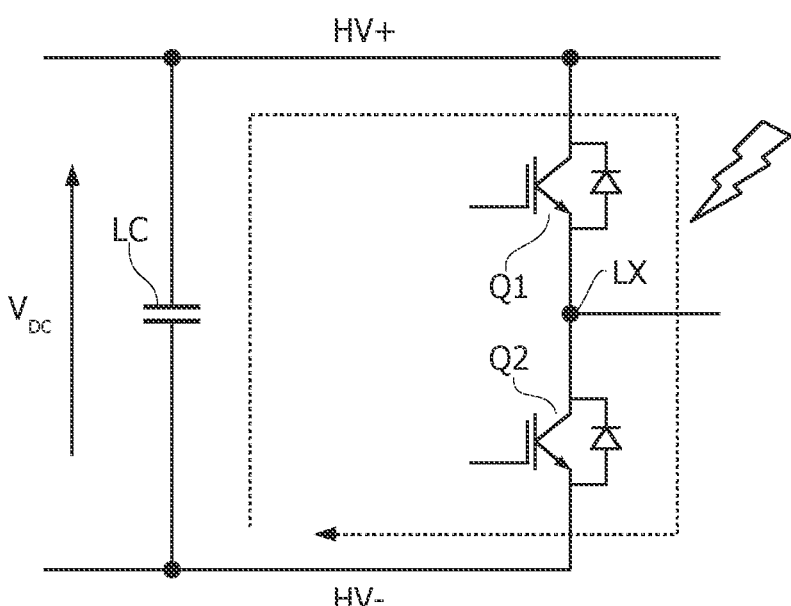
FIG. 1 has already been described in the foregoing.

One or more embodiments relate to a driver circuit configured to drive one switch (e.g., Q1 or Q2) of a half-bridge circuit to actively discharge a DC-Link capacitor LC, as discussed with reference to FIG. 1. To that effect, one or more embodiments may adopt an approach where one switch of the half-bridge (e.g., Q1 or Q2) is forced to a steady "ON" (conductive) state while a PWM signal is applied to the other switch of the half-bridge (e.g., Q2 or Q1, respectively). Either strategy may be suitable to carry out effective shoot-through discharge. Isolated gate driver devices of the type currently available under the trade designations L9502 and L9502B with companies of the STMicroelectronics group (see st.com) are exemplary of such driver circuits.

Figure 2:
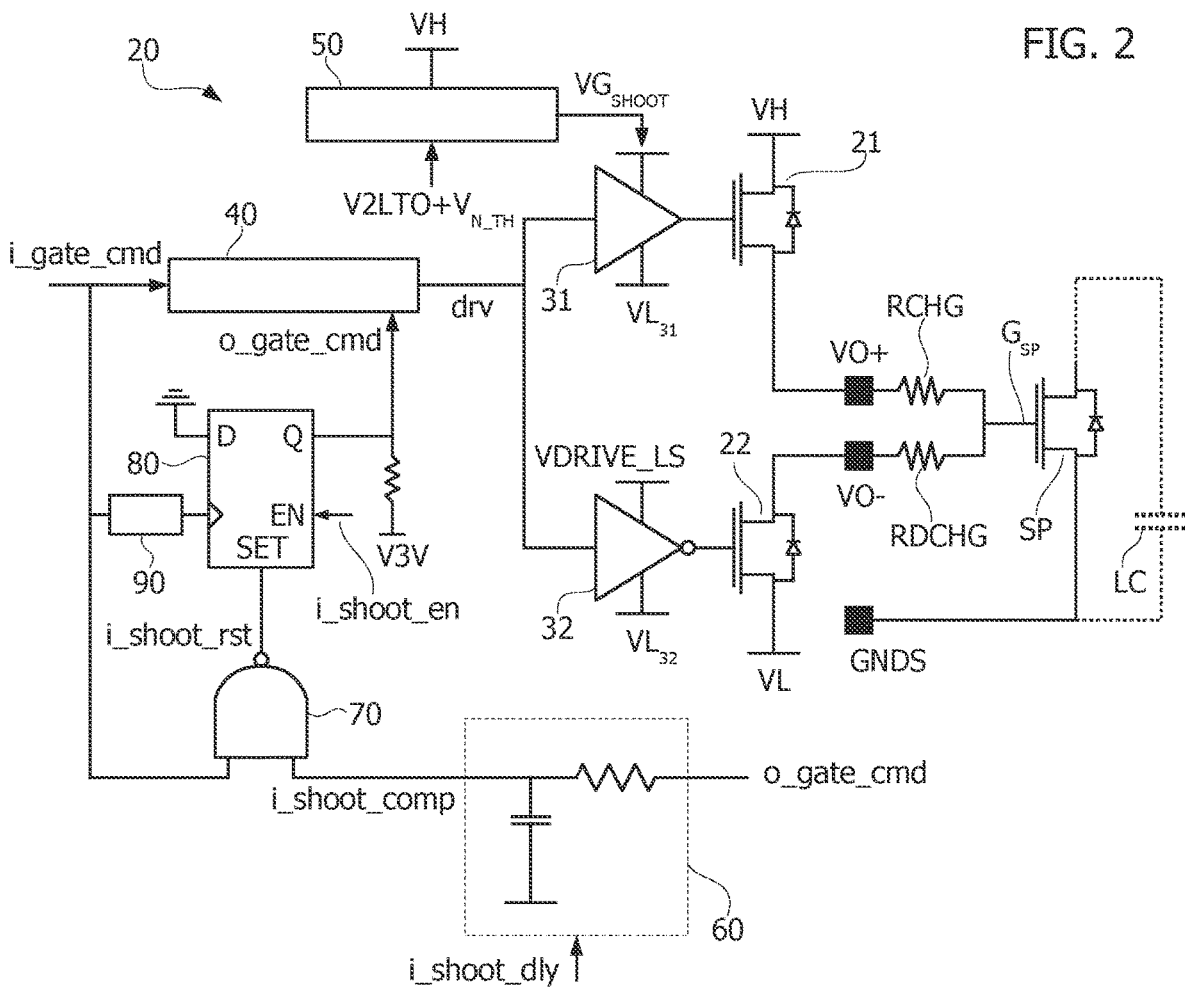
FIG. 2 is a circuit block diagram exemplary of a driver circuit according to one or more embodiments of the present description.

FIG. 2 is a circuit block diagram exemplary of a driver circuit 20 according to one or more embodiments. The driver circuit 20 can be used to discharge, on demand, an energized element (e.g., a DC-Link capacitor LC, shown in dashed lines) via at least one electronic switch SP. As previously discussed, the electronic switch SP may be one of the "phase" switches of a (three-phase) inverter for an electric motor (e.g., a traction motor of an electric vehicle), that is, switch SP could be one of switches Q1 and Q2 illustrated in FIG. 1. Switch SP has a control terminal $G_{SP}$ (e.g., a gate terminal in case switch SP is a field-effect transistor, either Si- or SiC-based, or an IGBT). Driver circuit 20 may be integrated as a pre-driver stage (e.g., in a driver device of the L9502/L9502B type as previously discussed) and coupled to a respective switch Qx in a traction inverter so that six driver circuits 20 can be provided on a same PCB to drive a three-phase traction inverter (with each inverter phase including two switches such as Q1 and Q2) that drives the U, V and W phases of an electric motor. It will thus be understood that the power switch and the energized element may be components external to one or more embodiments, which may be implemented as integrated driver circuits. For the sake of simplicity, the structure and operation of a single driver circuit 20 coupled to a single (discharge) external switch SP will be discussed in the following.

Substantially, the power switch SP can open or close a discharge path for the energized element LC (e.g., being arranged in parallel to the energized element, or otherwise being configured to open or close an electric path that runs in parallel to the energized element). When the driver circuit 20 provides a high voltage at its output VO+, the power switch SP switches to a conductive state and allows a current to flow through a discharge path of the energized element LC. In other words, the control signal at the control (e.g., gate) terminal of the power switch SP being asserted (e.g., high) allows a power flow between the drain and source terminals of the power switch SP, which in turn represents a discharge path for the energized element LC. The energy can thus be dissipated through the discharge path, whose main dissipating element may be the power switch SP itself.

As exemplified in FIG. 2, the driver circuit 20 includes a pair of electronic switches 21, 22 (e.g., power MOSFETs— possibly p-type and n-type, or both n-type). The first switch 21 (also referred to as high-side switch, not to be confused with the high-side switch Q1 of the inverter) is coupled between a first supply voltage node VH (e.g., high supply voltage) and a first output node VO+ (e.g., an output pin of the integrated circuit of driver 20), and the second switch 22 (also referred to as low-side switch, not to be confused with the low-side switch Q2 of the inverter) is coupled between a second output node VO− (e.g., an output pin of the integrated circuit of driver 20) and a second supply voltage node VL (e.g., low supply voltage). Switches 21, 22 have their control terminals (e.g., gate terminals, in the case of field-effect transistors or IGBTs) coupled to the output terminals of respective drive circuits 31, 32. The first drive circuit 31 (e.g., a non-inverting buffer) is supplied between a (programmable) voltage node $VG_{SHOOT}$ and a respective reference voltage node $VL_{31}$, and the second drive circuit 32 (e.g., an inverting buffer) is supplied between a (fixed) voltage node VDRIVE_LS and a respective reference voltage node $VL_{32}$. Reference voltage nodes $VL_{31}$ and $VL_{32}$ may be at the same voltage level or at different voltage levels, depending on the application. For instance, $VL_{31}$ may be tied to the voltage at pin VO+ (floating rail) and $VL_{32}$ may be tied to the voltage at pin VL.

The drive circuits 31, 32 are controlled by a drive signal drv produced at the output of a gate drive logic circuit 40 (e.g., a combinatorial logic circuit or a finite state machine, FSM) to which an external command signal i_gate_cmd (generated in a manner known to those of skill in the art—e.g., received from an application microcontroller mounted on the same PCB) and an internal command signal o_gate_cmd are applied.

In some embodiments, the gate drive logic circuit 40 may be configured to produce the drive signal dry as a combination of the external and internal command signals i_gate-_cmd and o_gate_cmd, in particular applying AND logic processing to the external command signal i_gate_cmd and to the complement of the internal command signal o_gate-_cmd (i.e., producing drv=i_gate_cmd AND NOT(o_gate-_cmd)).

In some embodiments, the gate drive logic circuit 40 may be configured to assert (e.g., set to a high logic value) the drive signal dry if its previous state was de-asserted (e.g., low) and signal i_gate_cmd has a rising edge and signal o_gate_cmd is de-asserted (e.g., low); and de-assert (e.g., set to a low logic value) the drive signal dry if its previous state was asserted and signal o_gate_cmd has a rising edge.

A programmable voltage generator circuit 50, supplied by voltage node VH (e.g., biased by the high supply voltage VH), receives a programming signal $V2LTO+V_{N\_TH}$ and produces the programmable supply voltage at node $VG_{SHOOT}$ for the drive circuit 31, as further discussed in the following. The voltage generator circuit 50 may include, for instance, a low-dropout (LDO) regulator that produces a programmable output voltage $VG_{SHOOT}$. The value of the output voltage $VG_{SHOOT}$ may be programmed, for instance, via a digital-to-analog converter (DAC), driven by one or more digital signals (e.g., the programming signal $V2LTO+V_{N\_TH}$) whose value can be set externally (e.g., by the user, by an application microcontroller) through a communication peripheral of the driver circuit 20, such as SPI, I²C or similar.

The switch drives/types (e.g., p-type and n-type) are configured in such a way that the switches 21, 22 can be switched on and off (made conductive and non-conductive) to vary the voltages at the nodes VO+ and VO− that are applied, respectively via resistors RCHG and RDCHG, to the control terminal $G_{SP}$ of the electronic power switch SP. In other terms, the output stage of pre-driver circuit 20 includes a push-pull stage including switches 21 and 22 that form a split output (VO+/VO−). In the (more common) case where switch SP is activated by applying thereto a "high" control voltage, turn-on of switch SP can be achieved via the VO+ output pin and the transition speed (off-to-on) can be trimmed by changing the resistance value of resistor RCHG, while turn-off of switch SP can be achieved via the VO− output pin and the transition speed (on-to-off) can be trimmed by changing the resistance value of resistor RDCHG. It is again noted that while exemplified herein as a MOSFET, the switch SP may comprise any type of voltage-controlled power element such as a silicon MOS-FET, a silicon carbide (SiC) MOSFET, an Insulated-Gate Bipolar Transistor (IGBT) or a gallium nitride (GaN) transistor, for instance. In case switch SP is a low-side switch of an inverter leg (e.g., Q2 with reference to FIG. 1), a ground terminal (e.g., source terminal) of switch SP may be coupled to a ground pin GNDS of the integrated circuit of driver 20. Both switch SP and the energized element (e.g., DC-Link capacitor LC) may be distinct elements from the embodiments, i.e., external to the integrated circuit of driver 20.

The driver circuit 20 includes a (programmable) delay circuit 60 configured to receive the internal command signal o_gate_cmd that is produced at the output of a flip-flop 80 as further detailed in the following. For instance, delay circuit 60 may include an analog delay circuit (e.g., a variable RC DAC low-pass circuit as exemplified in FIG. 2) that can be controlled (e.g., reset) via a delay-programming signal i_shoot_dly, whose value can be set externally (e.g., by the user, by an application microcontroller) through a communication peripheral of the driver circuit 20, such as SPI, PC or similar. Signal i_shoot_dly can be generated (in a manner known to those of skill in the art) in such a way that the delay circuit 60 applies a controlled delay (e.g., a delay selected in the range of 0 ns to 70 ns, in a selected number of steps of 5-10 ns) to signal o_gate_cmd to produce a delayed signal i_shoot_comp.

The driver circuit 20 includes a NAND logic gate 70 that receives at its input terminals the (possibly) delayed signal i_shoot_comp from delay circuit 60 and the external command signal i_gate_cmd that is also applied to the drive logic circuit 40, and applies NAND logic processing thereto to produce a set signal i_shoot_rst.

The driver circuit 20 includes a flip-flop circuit 80 that receives the set signal i_shoot_rst from the NAND logic gate 70 at its asynchronous active-high set terminal SET. Further, flip-flop 80 receives a delayed replica of the external command signal i_gate_cmd at its clock terminal. For instance, a delay circuit go (e.g., an RC delay circuit) may add a short delay (e.g., some nanoseconds, such as 5 ns to 10 ns) to the signal i_gate_cmd before propagating it to the clock terminal of flip-flop 80, so that a clock pulse reaches the flip-flop 80 sufficiently after the set signal i_shoot_rst is de-asserted. Further, flip-flop 80 receives a logic low voltage (e.g., analog ground voltage) at its data input terminal D, and an enable signal i_shoot_en at its enable terminal EN. The data output terminal Q of flip-flop 80 produces the internal command signal o_gate_cmd. The data output terminal Q of flip-flop 80 may be referenced to a logic power supply voltage (e.g., a 3.3 V voltage) via a resistor that couples the output terminal Q to a V3V node of circuit 20. Therefore, the flip-flop circuit 80 has an asynchronous set terminal that has priority over the sampling of the input data D (which takes place at rising edges of the clock signal). When the set signal i_shoot_rst is asserted (high), the data output terminal Q of flip-flop 80 (i.e., the internal command signal o_gate_cmd) is asserted (high) independently from the values of the clock signal and input data signal. When signal i_gate_cmd goes high, the SET terminal of flip-flop 80 is released and flip-flop 80 is enabled to sample the input data signal at terminal D at the rising edges of the delayed replica of signal i_gate_cmd. When signal o_gate_cmd goes low, the SET signal of flip-flop 80 is asserted again, after a programmable delay produced by the delay circuit 60.

Figure 3:
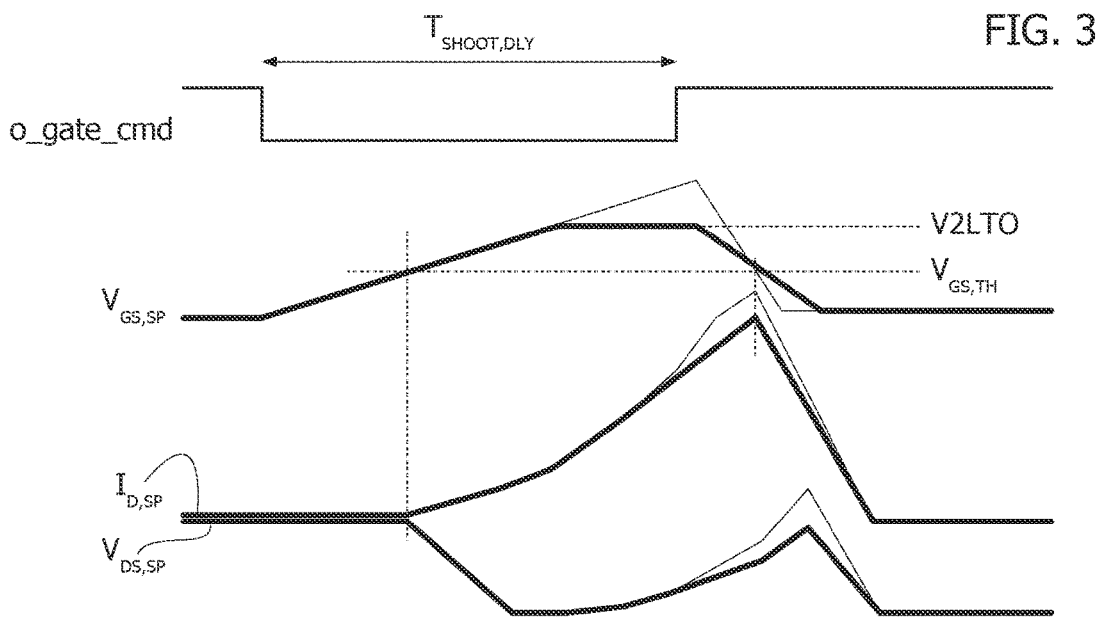
FIG. 3 is a time diagram including waveforms exemplary of signals in the circuit of FIG. 2.

Operation of a driver circuit 20 as exemplified in FIG. 2 will now be discussed, also with reference to FIG. 3, which is a time diagram including waveforms exemplary of the following signals: internal command signal o_gate_cmd, gate-source voltage $V_{GS,SP}$ of switch SP, current $I_{D,SP}$ through switch SP, and drain-source voltage $V_{DS,SP}$ of switch SP. In particular, FIG. 3 illustrates a comparison between the operation of one or more embodiments as exemplified in FIG. 2 (the thick lines of signals $V_{GS,SP}$, $I_{D,SP}$ and $V_{DS,SP}$) and the operation of the known solutions (the thin lines of signals $V_{GS,SP}$, $I_{D,SP}$ and $V_{DS,SP}$). In the turn-on phase of switch SP, the gate drive logic circuit 40 asserts signal dry (e.g., sets signal dry to a "high" logic value), thus activating the pre-driver circuit 31 to output voltage $VG_{SHOOT}$ and turning on switch 21 connected to the output pin VO+, which results in the power switch SP being turned on. Switches 21 and 22 are driven in counterphase to avoid cross-conduction. The pre-driver 31 and switch 21 are controlled to clamp the voltage at pin VO+ to a target value (e.g., V2LTO); in turn, the gate-source (or gate-emitter, in the case of IGBT) voltage of switch SP is clamped to the same target voltage V2LTO (see FIG. 3), insofar as the source (or emitter) of switch SP is coupled to the ground pin GNDS of driver circuit 20. Therefore, the programmable voltage $VG_{SHOOT}$ may be sized in order to compensate the gate-source voltage bias of switch 21, thus clamping the output voltage at pin VO+ to the target voltage V2LTO. Here, the pass-gate principle is applied, using the gate voltage of n-type transistor 21 (which operates as a voltage clamp) to regulate the output voltage at pin VO+. In fact, being transistor 21 an n-type MOS transistor, its source voltage (VO+) cannot exceed its gate voltage minus its threshold voltage, i.e., $VGATE_{21}-V_{N\_TH}$ (otherwise transistor 21 would turn-off by itself). Hence, by applying the programmable voltage $VG_{SHOOT}$ at the gate terminal of transistor 21, the voltage at pin VO+ can be modulated. When the programmable voltage $VG_{SHOOT}$ is applied to the gate terminal of transistor 21, transistor 21 is activated. Therefore, the source voltage of transistor 21 rises to $VG_{SHOOT}-V_{N\_TH}$ ($V_{N\_TH}$ being the threshold voltage of transistor 21). By way of example, if VH=18 V, $VG_{SHOOT}=16$ V and $V_{N\_TH}=3$ V, voltage VO+ would be clamped at $VG_{SHOOT}-V_{N\_TH}=13$ V. By programming the voltage $VG_{SHOOT}$ at the gate of transistor 21, it is possible to reach a desired gate threshold (at transistor 21) and thus finely control the drain-source ON resistance ($RDS_{on}$) of switch SP (which results in a better control of the discharge current through the power switch SP, in particular a lower peak of current $I_{D,SP}$ and a lower slope of voltage $V_{DS,SP}$ compared to known solutions, see FIG. 3), as exemplified by the following formula, where $V_{N\_TH}$ is the threshold voltage of transistor 21:

$$VO+ = VG_{SHOOT} - V_{N\_TH} = V2LTO + V_{N\_TH} = V2LTO$$

The delay circuit 60 applies a (programmable) delay $T_{SHOOT,DLY}$ to the internal command signal o_gate_cmd as soon as signal o_gate_cmd is asserted, to produce signal i_shoot_comp. The delay $T_{SHOOT,DLY}$ may be in the range from few nanoseconds to some hundreds of nanoseconds, e.g., to allow more design flexibility when adapting the design to different applications. When the delay $T_{SHOOT,DLY}$ expires, the gate drive logic resets (e.g., de-asserts, sets to a low logic value) the drive signal dry to the OFF state value, which in turns is transformed by the pre-driver 32 and switch 22 into a turn-off signal for switch SP. Thus, the time interval $T_{SHOOT,DLY}$ during which the high-side transistor 21 is turned on is determined by the duration of the negative pulse of the internal command signal o_gate_cmd. Such duration is programmable and can be selected by tuning the delay introduced by the delay circuit 60, as previously discussed. In particular, in the turn-off phase of switch SP, the gate drive logic circuit 40 de-asserts signal dry (e.g., sets signal dry to a "low" logic value), thus activating the pre-driver circuit 31 to output voltage VDRIVE_LS and turning on switch 22 connected to the output pin VO−, which results in the power switch SP being turned off. Again, switches 21 and 22 are always driven in counterphase to avoid cross-conduction. The turn-off procedure can be implemented according to various strategies. For instance, a soft turn-off procedure may be implemented in order to reduce the inductive spike via a gradual (e.g., controlled) shutdown of the switch SP.

Depending on the type of switch 21, two scenarios are possible: if switch 21 is implemented as a p-type MOS transistor, then an n-type MOS transistor may be implemented in parallel to switch 21; if switch 21 is implemented as an n-type MOS transistor, then the gate voltage of switch 21 may be controlled differently in the shoot-through scenario. The latter solution may result in a lower area impact.

Therefore, one or more embodiments as exemplified in FIG. 2 facilitate overcoming certain shortcomings of the known solutions, in particular by: i) improving robustness in respect of new application scenarios where the slope of the shoot-through current may reach values as high as 40 A/ns, and ii) avoiding the use of a closed loop based on a comparator that senses the gate voltage of switch SP, which introduces a reaction delay that may not be compatible with the target of limiting the current peak below the safe operating area of the external drive (e.g., of switch SP).

Figure 4:
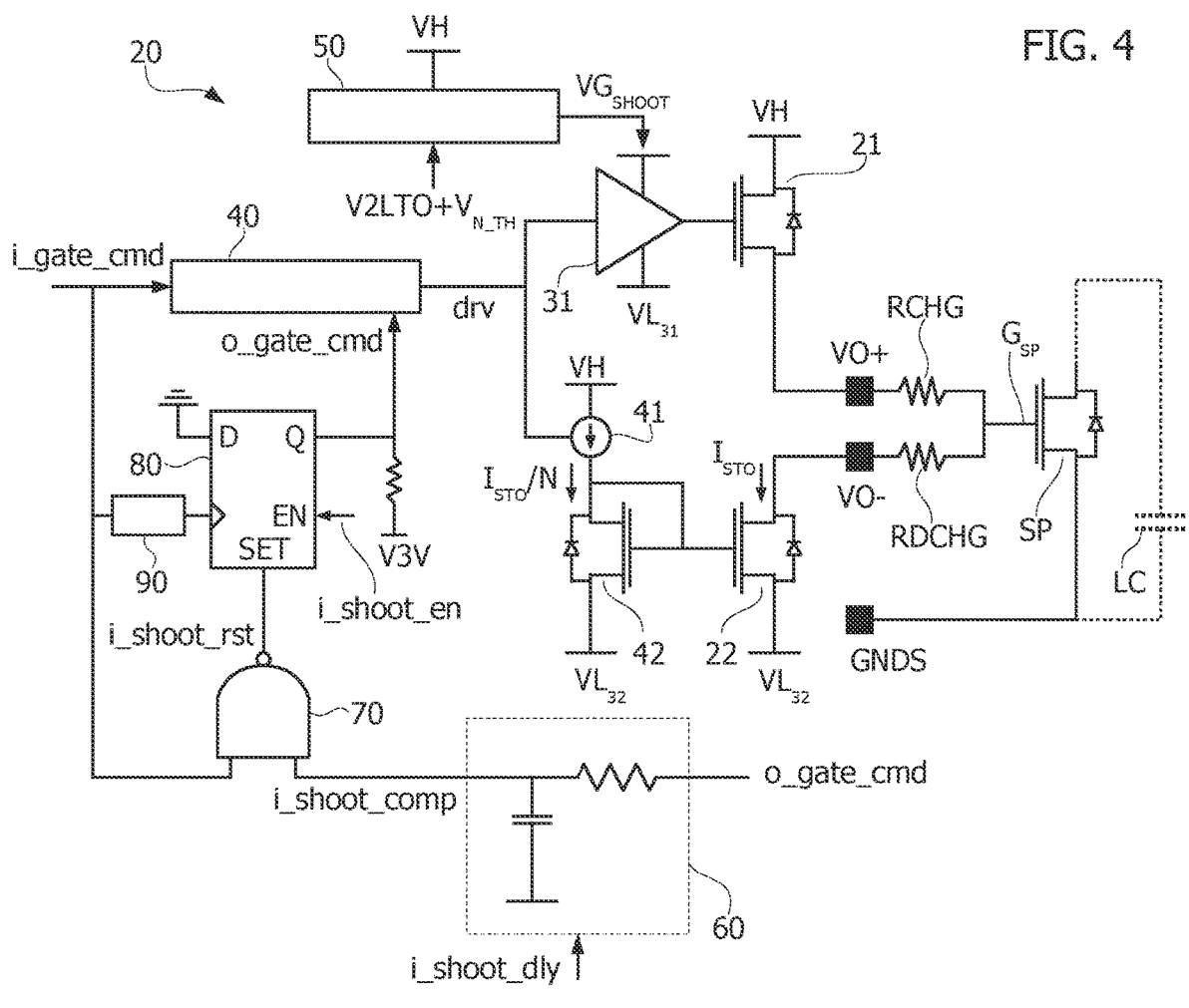
FIG. 4 is a circuit block diagram exemplary of a driver circuit according to other embodiments of the present description.

FIG. 4 is a circuit block diagram exemplary of a driver circuit 20 according to other embodiments, which include soft turn-off circuitry for controlling the turn-off phase of switch SP. Compared to the embodiments of FIG. 2, in the embodiments of FIG. 4 the pre-driver 32 is implemented as a current mirror (together with switch 22). In particular, pre-driver 32 includes a current generator circuit 41 coupled to the supply node VH and controlled by the gate drive logic circuit 40 to produce a current $I_{STO}/N$, and a diode-connected transistor 42 coupled in series to the current generator 41 (e.g., having its drain terminal coupled to current generator 41, its source terminal coupled to the supply node $VL_{32}$, and its gate terminal coupled to its drain terminal) to receive the current $I_{STO}/N$. Since the gate terminal of transistor 42 is coupled to the gate terminal of switch 22, current $I_{STO}/N$ is mirrored and rescaled by factor N to force a current $I_{STO}$ to flow through switch 22 during the turn-off phase of switch SP. Here, when the drive signal dry is asserted (e.g., high), the current generator 41 is disabled to avoid cross-conduction (and vice-versa).

Figure 5:
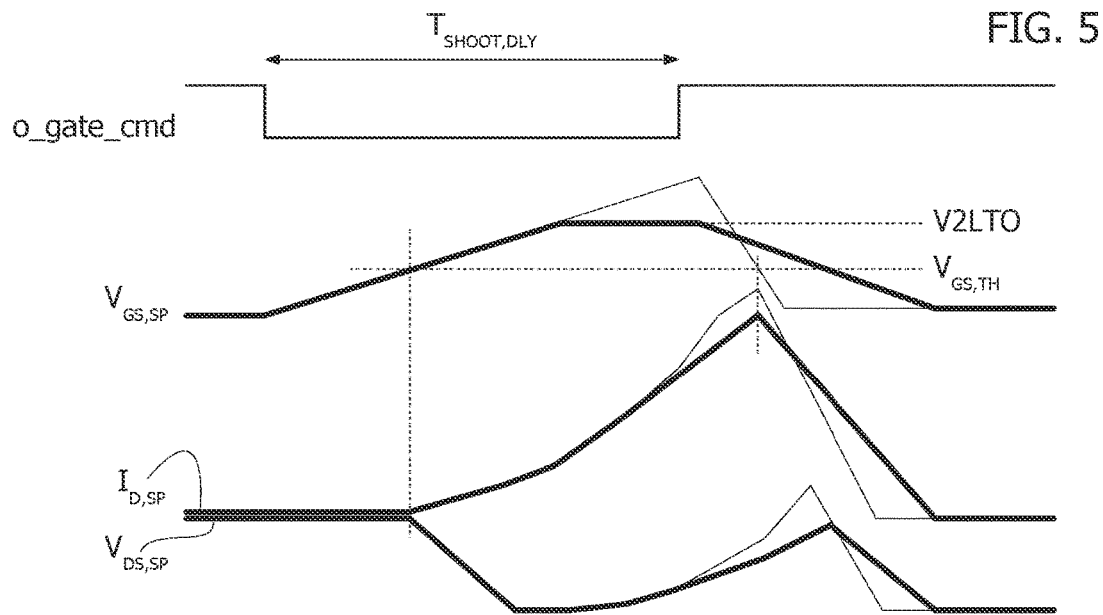
FIG. 5 is a time diagram including waveforms exemplary of signals in the circuit of FIG. 4.

Operation of a driver circuit 20 as exemplified in FIG. 4 will now be discussed, in particular concerning the turn-off phase of switch SP (the turn-on phase being substantially the same as previously discussed with reference to FIGS. 2 and 3) also with reference to FIG. 5, which is a time diagram including waveforms exemplary of the following signals: internal command signal o_gate_cmd, gate-source voltage $V_{GS,SP}$ of switch SP, current $I_{D,SP}$ through switch SP, and drain-source voltage $V_{DS,SP}$ of switch SP. In particular, FIG. 5 illustrates a comparison between the operation of one or more embodiments as exemplified in FIG. 4 (the thick lines of signals $V_{GS,SP}$, $I_{D,SP}$ and $V_{DS,SP}$) and the operation of the known solutions (the thin lines of signals $V_{GS,SP}$, $I_{D,SP}$ and $V_{DS,SP}$). In the turn-off phase of switch SP, when signal i_shoot_comp gest asserted (e.g., is set to a high logic value), the gate drive logic circuit 40 de-asserts (e.g., sets to a low logic value) the drive signal drv, thus activating the pre-driver 41, 42, 22 connected to the output pin VO–. Switch 22 is controlled so as to decrease the voltage at pin VO– (and in turn decrease the gate-source voltage $V_{GS,SP}$ of switch SP) via a controlled (e.g., programmable) current $I_{STO}$. By controlling the value of the soft turn-off current $I_{STO}$, the overshoot of the drain-source voltage $V_{DS,SP}$ (or the collector-emitter voltage in case of an IGBT) of switch SP due to the overcurrent caused by the shoot-through event can be limited (which results in a lower slope of current $I_{D,SP}$ during the turn-off phase and a lower overshoot of voltage $V_{DS,SP}$ compared to known solutions, see FIG. 5), introducing a soft-turn off (STO). For instance, the value of the current $I_{STO}$ may be selected via an SPI command so as to adapt the duration of the discharge phase (and consequently the overshoot of voltage $V_{DS}$ or $V_{CE}$) to different applications.

Therefore, one or more embodiments as exemplified in FIG. 4 facilitate overcoming a further shortcoming of the known solutions, in particular by providing a soft-turn off procedure for switch SP.

One or more embodiments as exemplified herein may thus provide one or more of the following advantages: reduced output current slope during a controlled shoot-through ON phase, even in 800 V systems and in the case of very small parasitic inductance in the driver output loop; high flexibility allowing the system designer to fine tune the on-resistance of switch SP (RDSon), by clamping the gate-source ON voltage of switch SP at the desired target value V2LTO; ability to reach the target gate-source ON voltage of switch SP in a short time, relying on the functional switch 21 (in case of NMOS output stage); limitation of the current peaks in the switch SP to values that are within the safe operating area of switch SP, which results in improved the reliability of the driver stage.

Without prejudice to the underlying principles, the details and embodiments may vary, even significantly, with respect to what has been described by way of example only, without departing from the extent of protection.

The extent of protection is determined by the annexed claims.

What is claimed is:

1. A driver circuit, comprising:
a high-side switch coupled between a first supply voltage node and a first output pin of the driver circuit;
a low-side switch coupled between a second output pin of the driver circuit and a second supply voltage node, wherein the first and second output pins are configured to be coupled to a control terminal of a power switch to provide thereto a control signal;
a high-side drive circuit configured to drive the high-side switch, the high-side drive circuit being supplied by a programmable voltage;
a low-side drive circuit configured to drive the low-side switch, the low-side drive circuit being supplied by a fixed voltage;
a programmable voltage generator circuit configured to receive a programming signal and produce the programmable voltage as a function thereof; and
control circuitry coupled to the high-side and low-side drive circuits and configured to:
receive an input command signal;
in response to assertion of the input command signal, assert a drive signal to activate the high-side drive circuit, thereby turning on the high-side switch, clamping the first output pin at the programmable voltage minus a threshold voltage of the high-side switch, and turning off the low-side switch;
monitor a time interval starting from the assertion of the input command signal; and
in response to expiration of the time interval, de-assert the drive signal to activate the low-side drive circuit, thereby turning on the low-side switch, tying the second output pin to the second supply voltage node, and turning off the high-side switch;
whereby the control signal for the power switch is produced at the first and second output pins of the driver circuit.

2. The driver circuit of claim 1, wherein the high-side switch includes an n-type metal-oxide-semiconductor transistor having a drain terminal coupled to the first supply voltage node, a source terminal coupled to the first output pin of the driver circuit, and a gate terminal coupled to the high-side drive circuit.

3. The driver circuit of claim 1, wherein the programmable voltage is equal to an analog-converted value of the programming signal.

4. The driver circuit of claim 1, wherein the programmable voltage generator circuit comprises a low-dropout voltage regulator.

5. The driver circuit of claim 1, wherein the control circuitry comprises a logic circuit configured to receive the input command signal and an internal command signal, and produce the drive signal by:

applying AND logic processing to the input command signal and a complement of the internal command signal.

6. The driver circuit of claim 1, wherein the control circuitry comprises a logic circuit configured to receive the input command signal and an internal command signal, and produce the drive signal by:

asserting the drive signal in response to the drive signal having been de-asserted, the input command signal having a first rising edge, and the internal command signal being de-asserted; and de-asserting the drive signal in response to the drive signal having been asserted, and the internal command signal having a second rising edge.

7. The driver circuit of claim 6, further comprising:

a delay circuit configured to delay propagation of the internal command signal of an amount equal to the time interval to produce a delayed internal command signal;

a logic gate configured to receive the delayed internal command signal and the input command signal, and de-assert a set signal in response to the delayed internal command signal and the input command signal being both asserted; and a flip-flop circuit configured to:

receive the set signal at an asynchronous set input terminal;

receive a delayed replica of the input command signal at a clock terminal;

receive a logic low voltage at a data input terminal;

receive an enable signal at an enable input terminal; and produce the internal command signal at a data output terminal.

8. The driver circuit of claim 7, wherein the time interval is between 0 nanoseconds and 70 nanoseconds.

9. The driver circuit of claim 1, wherein the low-side drive circuit comprises:

a current generator circuit controlled by the control circuitry to produce a programmable current; and a diode-connected transistor coupled in series with the current generator circuit to receive the programmable current;

wherein a control terminal of the diode-connected transistor is connected to a control terminal of the low-side switch, whereby the programmable current is mirrored through the low-side switch.

10. The driver circuit of claim 9, wherein a value of the programmable current is selectable via a Serial Peripheral Interface (SPI) command.

11. An electronic system, comprising:

a first high-voltage rail;

a second high-voltage rail;

a stabilization capacitor coupled between the first and second high-voltage rails;

a half-bridge circuit coupled between the first and second high-voltage rails, the half-bridge circuit comprising:

a high-side power switch arranged between the first high-voltage rail and a switching node; and a low-side power switch arranged between the switching node and the second high-voltage rail; and a driver circuit comprising:

a high-side switch coupled between a first supply voltage node and a first output pin of the driver circuit;

a low-side switch coupled between a second output pin of the driver circuit and a second supply voltage node;

a high-side drive circuit configured to drive the high-side switch, the high-side drive circuit being supplied by a programmable voltage;

a low-side drive circuit configured to drive the low-side switch, the low-side drive circuit being supplied by a fixed voltage;

a programmable voltage generator circuit configured to receive a programming signal and produce the programmable voltage as a function thereof; and control circuitry coupled to the high-side and low-side drive circuits and configured to:

receive an input command signal;

in response to assertion of the input command signal, assert a drive signal to activate the high-side drive circuit, thereby turning on the high-side switch, clamping the first output pin at the programmable voltage minus a threshold voltage of the high-side switch, and turning off the low-side switch;

monitor a time interval starting from the assertion of the input command signal; and in response to expiration of the time interval, de-assert the drive signal to activate the low-side drive circuit, thereby turning on the low-side switch, tying the second output pin to the second supply voltage node, and turning off the high-side switch;

wherein the first and second output pins of the driver circuit are coupled to a control terminal of a first one of the high-side and low-side power switches to provide thereto a control signal; and wherein during a discharge phase of the stabilization capacitor, one of the high-side and low-side power switches is forced to a steady conductive state and the other of the high-side and low-side power switches receives the control signal from the driver circuit to discharge the stabilization capacitor.

12. The electronic system of claim 11, wherein the power switch that is forced to the steady conductive state is the high-side power switch and the power switch that is coupled to the driver circuit is the low-side power switch, and wherein the low-side power switch has a ground terminal coupled to a ground pin of the driver circuit.

13. The electronic system of claim 11, further comprising a low-voltage domain and a high-voltage domain, wherein the driver circuit is included together with the half-bridge circuit in the high-voltage domain.

14. The electronic system of claim 11, wherein the high-side switch includes an n-type metal-oxide-semiconductor transistor having a drain terminal coupled to the first supply voltage node, a source terminal coupled to the first output pin of the driver circuit, and a gate terminal coupled to the high-side drive circuit.

15. The electronic system of claim 11, wherein the programmable voltage is equal to an analog-converted value of the programming signal.

16. The electronic system of claim 11, wherein the programmable voltage generator circuit comprises a low-drop-out voltage regulator.

17. The electronic system of claim 11, wherein the control circuitry comprises a logic circuit configured to receive the input command signal and an internal command signal, and produce the drive signal by:

asserting the drive signal in response to the drive signal having been de-asserted, the input command signal having a first rising edge, and the internal command signal being de-asserted; and de-asserting the drive signal in response to the drive signal having been asserted, and the internal command signal having a second rising edge.

18. The electronic system of claim 17, wherein the driver circuit further comprises:

a delay circuit configured to delay propagation of the internal command signal of an amount equal to the time interval to produce a delayed internal command signal;

a logic gate configured to receive the delayed internal command signal and the input command signal, and de-assert a set signal in response to the delayed internal command signal and the input command signal being both asserted; and a flip-flop circuit configured to:

receive the set signal at an asynchronous set input terminal;

receive a delayed replica of the input command signal at a clock terminal;

receive a logic low voltage at a data input terminal;

receive an enable signal at an enable input terminal; and produce the internal command signal at a data output terminal.

19. The electronic system of claim 11, wherein the low-side drive circuit comprises:

a current generator circuit controlled by the control circuitry to produce a programmable current; and a diode-connected transistor coupled in series with the current generator circuit to receive the programmable current;

wherein a control terminal of the diode-connected transistor is connected to a control terminal of the low-side switch, whereby the programmable current is mirrored through the low-side switch.

20. A vehicle comprising:

an electronic system comprising:

a first high-voltage rail;

a second high-voltage rail;

a stabilization capacitor coupled between the first and second high-voltage rails;

a half-bridge circuit coupled between the first and second high-voltage rails, the half-bridge circuit comprising:

a high-side power switch arranged between the first high-voltage rail and a switching node; and a low-side power switch arranged between the switching node and the second high-voltage rail; and a driver circuit comprising:

a high-side switch coupled between a first supply voltage node and a first output pin of the driver circuit;

a low-side switch coupled between a second output pin of the driver circuit and a second supply voltage node;

a high-side drive circuit configured to drive the high-side switch, the high-side drive circuit being supplied by a programmable voltage;

a low-side drive circuit configured to drive the low-side switch, the low-side drive circuit being supplied by a fixed voltage;

a programmable voltage generator circuit configured to receive a programming signal and produce the programmable voltage as a function thereof; and control circuitry coupled to the high-side and low-side drive circuits and configured to:

receive an input command signal;

in response to assertion of the input command signal, assert a drive signal to activate the high-side drive circuit, thereby turning on the high-side switch, clamping the first output pin at the programmable voltage minus a threshold voltage of the high-side switch, and turning off the low-side switch;

monitor a time interval starting from the assertion of the input command signal; and in response to expiration of the time interval, de-assert the drive signal to activate the low-side drive circuit, thereby turning on the low-side switch, tying the second output pin to the second supply voltage node, and turning off the high-side switch;

wherein the first and second output pins of the driver circuit are coupled to a control terminal of a first one of the high-side and low-side power switches to provide thereto a control signal; and wherein during a discharge phase of the stabilization capacitor, one of the high-side and low-side power switches is forced to a steady conductive state and the other of the high-side and low-side power switches receives the control signal from the driver circuit to discharge the stabilization capacitor; and an electric motor having at least one winding configured to be driven by the half-bridge circuit.

* * * * *